(12) United States Patent
Hebert et al.

(10) Patent No.: US 9,236,470 B2
(45) Date of Patent: Jan. 12, 2016

(54) SEMICONDUCTOR POWER DEVICE AND METHOD OF FABRICATING THE SAME

(71) Applicant: MagnaChip Semiconductor, Ltd., Cheongju-si (KR)

(72) Inventors: Francois Hebert, Cheongju-si (KR); Young Bae Kim, Cheongju-si (KR); Jin Woo Moon, Cheongju-si (KR); Kyung Ho Lee, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/138,631

(22) Filed: Dec. 23, 2013

(65) Prior Publication Data

US 2014/0353749 A1    Dec. 4, 2014

(30) Foreign Application Priority Data

Jun. 4, 2013    (KR) .......................... 10-2013-0064269

(51) Int. Cl.
*H01L 29/66*    (2006.01)
*H01L 29/78*    (2006.01)

(52) U.S. Cl.
CPC .................. *H01L 29/7816* (2013.01)

(58) Field of Classification Search
CPC ............ H01L 29/7835; H01L 29/7816; H01L 29/66659; H01L 29/0634; H01L 29/66681; H01L 29/063; H01L 29/78624; H01L 29/0684; H01L 29/0688; H01L 29/36; H01L 29/7801
USPC .................................. 257/262, 343, 342, 337
See application file for complete search history.

(56) References Cited

U.S. PATENT DOCUMENTS

| 5,313,082 | A | 5/1994 | Eklund | |
| 6,168,983 | B1 | 1/2001 | Rumennik et al. | |
| 6,909,143 | B2 * | 6/2005 | Jeon et al. | 257/335 |
| 7,126,166 | B2 * | 10/2006 | Nair et al. | 257/110 |
| 2010/0025726 | A1 * | 2/2010 | Paul et al. | 257/141 |

* cited by examiner

*Primary Examiner* — Wael Fahmy
*Assistant Examiner* — Sarah Salerno
(74) *Attorney, Agent, or Firm* — NSIP Law

(57) ABSTRACT

A semiconductor power device and a method of fabricating the same are provided. The semiconductor power device involving: a first conductivity type semiconductor substrate; an epitaxial layer formed on the semiconductor substrate; a second conductivity type well formed in the semiconductor substrate and the epitaxial layer; a drain region formed in the well; an oxide layer that insulates a gate region from the drain region; a first conductivity type buried layer formed in the well; a second conductivity type drift region surrounding the buried layer; and a second conductivity type TOP region formed between the buried layer and the oxide layer.

22 Claims, 19 Drawing Sheets

SEMICONDUCTOR POWER DEVICE AND METHOD OF FABRICATING THE SAME

CROSS-REFERENCE TO RELATED APPLICATION

This application claims the benefit under 35 U.S.C. §119 to Korean Patent Application No. 10-2013-0064269 filed on Jun. 4, 2013, in the Korean Intellectual Property Office, the entire disclosure of which is incorporated herein by reference for all purposes.

BACKGROUND

1. Field

The following description relates to a semiconductor power device and a method of fabricating the same, and to, for example, a semiconductor power device with at least one buried layer and a method of fabricating the same without a high-energy ion implantation process, the buried layer being formed by adding one or more epitaxial layers in a high-voltage lateral DMOS (LDMOS).

2. Description of Related Art

MOSFET devices with high-switching frequency and low power loss have been widely used in power conversion and regulation circuits. There are multiple types of Power MOSFET devices that are referred to as double-diffused DMOS transistors. For example, there is a vertical version of a DMOS transistor, known as vertical double-diffused metal oxide semiconductor (VDMOS). Also, there is a lateral version of a DMOS transistor, known as lateral double-diffused metal oxide semiconductor (LDMOS).

When a silicon-on-insulator (SOI) substrate is used to fabricate a power integrated circuit (power IC), the manufacturing process may be simplified as compared to that used with a bulk silicon substrate. However, the cost of SOI substrates is too high for the practical application of such a manufacturing process for most purposes.

VDMOS transistors have large power handling capabilities. However, VDMOS transistors are more difficult to realize in an IC technology in comparison to LDMOS transistors. Thus, LDMOS devices are widely used as a switch for control, logic, and power. LDMOS devices require a high breakdown voltage to endure a high applied voltage. At the same time, these devices require low on-resistance to minimize conduction losses.

A reduced surface field (RESURF) structure, which reduces the peak electric field in the drain region of MOSFETs to obtain a high breakdown voltage and low on-resistance simultaneously, has been developed in the early 1980's. However, in the RESURF processing of conventional art, a high-energy ion implantation process of typically greater than 1 MeV is needed to form the P type buried layer in order to achieve a depth that is sufficient to form the first conduction path. In addition, in the event that additional P type buried layers have to be formed to further reduce the resistance, even higher ion-implantation energy is necessary to form the additional P type buried layers. For instance, an implantation process involving greater than 2 MeV may be necessary, which may not be feasible in many device fabrication facilities.

SUMMARY

In one general aspect, there is provided a semiconductor power device including: a first conductivity type semiconductor substrate; an epitaxial layer formed on the semiconductor substrate; a second conductivity type well formed in the semiconductor substrate and the epitaxial layer; a drain region formed in the well; an oxide layer that insulates a gate region from the drain region; a first conductivity type buried layer formed in the well; a second conductivity type drift region surrounding the buried layer; and a second conductivity type TOP region formed between the buried layer and the oxide layer.

The general aspect of the semiconductor power device may include a plurality of buried layers and a plurality of drift regions, the plurality of drift regions each surrounding a buried layer of the plurality of buried layers, and the plurality of buried layers may be spaced apart from each other along a vertical direction below the oxide layer, and the plurality of drift regions may partially overlap with each other.

The epitaxial layer may be a first conductivity type epitaxial layer. The drift region may completely enclose the buried layer. The TOP region may be formed in a channel between the oxide layer and the buried layer and extends toward the gate region in a horizontal direction.

The oxide layer may include one selected from the group consisting of a local oxidation of silicon (LOCOS) oxide layer, a plate-shaped oxide layer, and a shallow trench isolation (STI) layer.

The general aspect of the semiconductor power device may further include a first conductivity type body region formed in a portion of the epitaxial layer in which the well is not formed.

The drain region may be formed in a trench structure, and drain region may contact one end of the drift region and one end of the buried layer.

The general aspect of the semiconductor power device may include a plurality of epitaxial layers, the first conductivity type epitaxial layer being one of the plurality of epitaxial layers.

In another general aspect, there is provided a semiconductor power device including: a first conductivity type semiconductor substrate; a second conductivity type epitaxial layer formed on the semiconductor substrate; a second conductivity type well formed in the semiconductor substrate and the epitaxial layer; a drain region formed in the well; an oxide layer that insulates a gate region from the drain region; a first conductivity type first buried layer formed in the well; a first conductivity type second buried layer formed in a portion of the epitaxial layer in which the well is not formed; a second conductivity type first drift region surrounding the first buried layer; and a second conductivity type TOP region formed between the buried layer and the oxide layer.

The general aspect of the semiconductor power device may include a plurality of first buried layers and a plurality of first drift regions, the plurality of first drift regions each surrounding a first buried layer of the plurality of first buried layers. The plurality of first buried layers may be spaced apart from each other along a vertical direction below the oxide layer, and the plurality of first drift regions may partially overlap with each other.

The first drift region may completely enclose the first buried layer. The TOP region may be formed in a channel between the oxide layer and the buried layer and may extend toward the gate region in a horizontal direction.

The general aspect of the semiconductor power device may include a plurality of second buried layers, the plurality of second buried layers being spaced apart from each other along a vertical direction below the oxide layer.

The oxide layer may include one selected from the group consisting of a local oxidation of silicon (LOCOS) oxide layer, a plate-shaped oxide layer, and a shallow trench isolation (STI) layer.

The general aspect of the semiconductor power device may further include a first conductivity type body region formed in a portion of the epitaxial layer in which the well is not formed.

The drain region may be formed in a trench structure. The drain region may contact one end of the first drift region and one end of the first buried layer.

The general aspect of the semiconductor power device may include a plurality of epitaxial layers, the second conductivity type epitaxial layer being one of the plurality of epitaxial layers, and the plurality of epitaxial layers may include an epitaxial layer doped with first conductivity type impurities.

In another general aspect, there is provided a method of fabricating a semiconductor power device, the method involving: (A) forming a second conductivity type well in a first conductivity type semiconductor substrate; (B) forming a first conductivity type first buried layer in the well; (C) forming a second conductivity type first drift region that surrounds the first buried layer; (D) growing an epitaxial layer on the semiconductor substrate; (E) forming a first conductivity type drain region in the well; and (F) forming a first conductivity body region in one region of the epitaxial layer in which the well is not formed.

In the general aspect of the method, the first drift region may be formed to completely enclose the first buried layer in (C), and the epitaxial layer grown on the semiconductor substrate may be a first conductivity type epitaxial layer in (D).

The general aspect of the method may further include forming an oxide layer that insulates a gate region from the drain region in the epitaxial layer.

The general aspect of the method may further involve forming a first conductivity type contact region in one region of the epitaxial layer in which the well is not formed before the forming of the body region.

The general aspect of the method may further involve: before (E), forming a first conductivity type second buried layer vertically spaced apart from the first buried layer; and forming a second conductivity type second drift region that surrounds the second buried layer and partially overlaps with the first drift region.

In another general aspect, there is provided a method of fabricating a semiconductor power device, the method involving: (A) forming a second conductivity type well in a first conductivity type semiconductor substrate; (B) forming a first conductivity type first buried layer in the well; (C) forming a second conductivity type first drift region surrounding the first buried layer; (D) growing a first conductivity type first epitaxial layer on the semiconductor substrate; (E) forming a first conductivity type second buried layer in a surface of the first epitaxial layer to be vertically spaced apart from the first buried layer; (F) forming a second conductivity type second drift region that surrounds the second buried layer; (G) growing a first conductivity type second epitaxial layer on the first epitaxial layer; (H) forming a first conductivity type drain region in the well; and (I) forming a first conductivity type body region in one region of the second epitaxial layer in which the well is not formed.

The first drift region may completely enclose the first buried layer in (C). The second drift region may completely enclose the second buried layer in (F). The second drift region may partially overlap with the first drift region.

The general aspect of the method may further involve forming an oxide layer that insulates a gate region from the drain region in the second epitaxial layer.

The general aspect of the method may further involve forming a first conductivity type contact region in regions of the first and second epitaxial layers in which the well is not formed before the forming of the body region.

The general aspect of the method may further involve: before (H), forming a first conductivity type third buried layer to be vertically spaced apart from the second buried layer; and forming a second conductivity type third drift region that completely encloses the third buried layer and partially overlapping the second drift region.

The general aspect of the method may further involve growing a first conductivity type third epitaxial layer on the second epitaxial layer.

In another general aspect, there is provided a method of fabricating a semiconductor power device comprising: (A) forming a second conductivity type well in a first conductivity type semiconductor substrate; (B) forming a first conductivity type first buried layer in the well; (C) forming a second conductivity type first drift region that surrounds the first buried layer; (D) growing a second conductivity type epitaxial layer on the semiconductor substrate; (E) forming a first conductivity type drain region in the well; and (F) forming a first conductivity type body region in one region of the epitaxial layer in which the well is not formed.

The first drift region may be formed to completely enclose the first buried layer in (C).

The general aspect of the method may further involve forming a first conductivity type second buried layer in one region of the semiconductor substrate in which the well is not formed before (D).

In the general aspect of the method, a plurality of first buried layers and a plurality of second buried layers may be provided, and the plurality of first buried layers and the plurality of second buried layer may be formed to be spaced apart from each other in a vertical direction.

The general aspect of the method may further involve forming an oxide layer in the epitaxial layer, the oxide layer insulating a gate region from the drain region.

The general aspect of the method may further involve forming a first conductivity contact region in one region of the epitaxial layer in which the well is not formed before the forming of the body region.

Other features and aspects may be apparent from the following detailed description, the drawings, and the claims.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It will be understood that, although the terms first, second, A, B, etc. may be used herein in reference to elements of a device, such elements should not be construed as limited by these terms. For example, a first element could be termed a second element, and a second element could be termed a first element, without departing from the scope of the present disclosure. Herein, the term "and/or" includes any and all combinations of one or more referents.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The term "first conductivity" and "second conductivity" denote opposite conductivity type to each other such as an N type and a P type and the embodiments described and illustrated herein include complementary embodiments thereof. Hereinafter, an example will be illustrated and described in which the first conductivity type is the P type and the second conductivity type is the N type.

Figure 1:
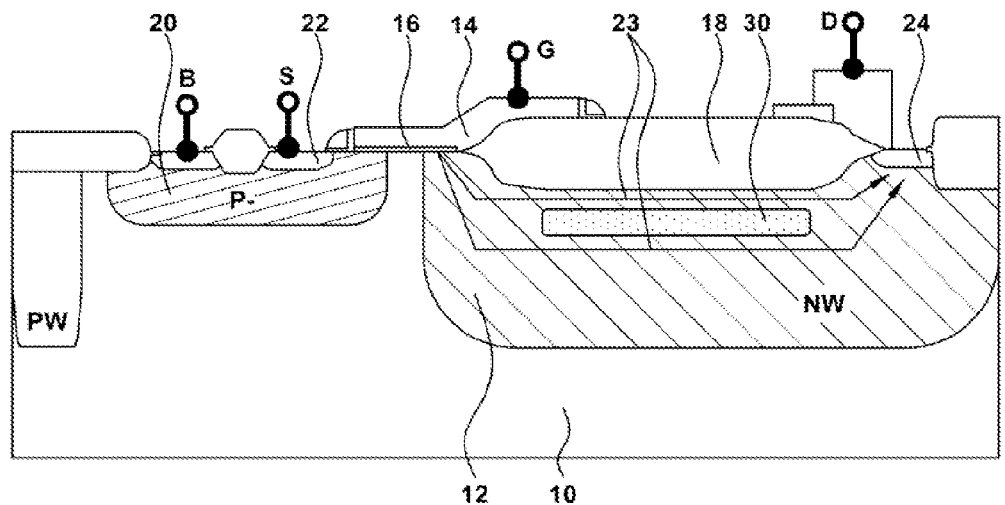
FIG. 1 is a cross-sectional view illustrating an example of an LDMOS device to which a double RESURF structure is applied to obtain a high breakdown voltage.

FIG. 1 is a cross-sectional view illustrating an example of an LDMOS device to which a RESULF structure is applied to obtain a high breakdown voltage. The device depicted in FIG. 1 is referred to as a triple RESURF LDMOS since there are two parallel drift-conduction regions in the drain extension region: one N type region above the P type buried layer 30, and another N type region formed in the deep N type well region 12 below the P type buried layer 30.

The "triple" term comes from the fact that there are three different charge balanced regions (three NP or PN regions): a first charge balanced region between the LOCOS oxide layer 18 and the P type buried region 30, a second charge balanced region between the P type buried layer 30 and the N type region underneath it (deep B type well), and a third charge balanced region between the deep N type well region 12 and the P type substrate 10.

As illustrated in FIG. 1, a deep N type well 12 is formed in a predetermined region of a P-type substrate 10. An insulating layer is formed over the deep N type well 12, including a thin gate oxide layer 16 and a local oxidation of silicon (LOCOS) oxide layer 18. A gate region 14 is formed over a portion of the LOCOS oxide layer 18 and deep N type well region 12 to form an accumulation region, and over a portion outside of the N-well to form a channel region in one side of the deep N type well region 12.

A P-type body region 20 is formed in one side of the gate region 14 and a source contact region 22 is included in the P-type body region 20.

An N+ type region 24 forms a drain terminal isolated from the gate region 14 by the LOCOS oxide layer 18, and the N+ type region 24 is formed in the deep N type well 12 at the opposite side of the channel 23.

A gate electrode G is connected to the gate region 14, a source electrode S is connected to the source contact region 22, and a drain electrode D is connected to the N+ type region 24.

To achieve a high breakdown voltage, a P type buried layer 30, which is typically formed by using high energy boron ion implantation to penetrate through the thick LOCOS oxide layer 18, is formed in the drain extension. This P type buried layer 30 is formed under the LOCOS oxide layer 18 in such that two N type conduction regions remain above and below the P type buried layer 30.

Therefore, two current paths are formed: a first path for current flow between the source electrode S and the drain electrode D is formed between the LOCOS oxide layer 18 and the P type buried layer 30, and a second path between the Source electrode S and the drain electrode D between the P type buried layer 30 and the P type substrate 10 within the deep N type well 12.

At that time, multiple P type buried layer 30 is formed, the total resistance of the LDMOS device because of multiple current path. From now, a semiconductor power device that comprising the P type buried layer 30 in a LDMOS device, and a method of fabricating the same, will be described.

Figure 2:
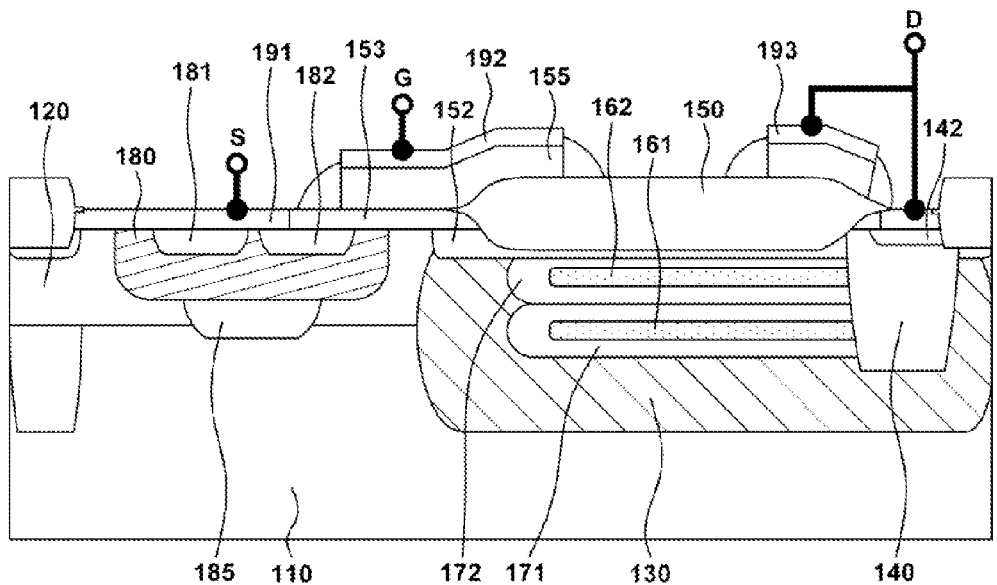
FIG. 2 is a cross-sectional view illustrating an example of a power device according to the present disclosure.

FIG. 2 is a cross-sectional view of an example of a power device according to a general aspect of the present disclosure.

As illustrated in FIG. 2, in one example of a semiconductor power device, a P type epitaxial layer 120 is formed on a P type semiconductor substrate 110. A first P type buried layer 161, a second P type buried layer 162, a first N type drift region 171, a second N type drift region 172 surrounding the first P type buried layer 161, and a second P type buried layer 162, respectively, are formed in a deep N type well 130 that is formed in a predetermined region of the substrate 110. In this example, the first N type drift region 171 and the second N type drift region 172 fully enclose the first P type buried layer 161 and the second P type buried layer 162, respectively. However, the arrangement of the first and second N type drift regions 171 and 172 may differ in other examples, and the present disclosure is not limited to the example depicted in FIG. 2.

At this time, the ion implantation concentration of the first N type drift region 171 and the second N type drift region 172 is relatively higher than that of the deep N type well 130 because the first N type drift region 171 and the second N type drift region 172 are formed by performing an additional ion implanting process to the deep N type well 130. Thus, the ion implantation concentration of the N type drift region is relatively higher than that of the deep N type well 130. As a result, the on-resistance of the device becomes lower. Using this characteristic, it is possible to fabricate a power device having low on-resistance.

FIG. 2 illustrates two P type buried layers and two N type drift regions that fully enclose the buried layers. However, in another example, a plurality of P type buried layers and a plurality of N type drift regions may be provided, and the P type buried layers may be formed to be spaced from each other in a vertical direction. At this time, a P type buried layer, which is the uppermost P type buried layer located closest to a surface of the power device may be formed in a horizontal direction of the P type substrate 100, spaced apart from an oxide layer 150. In the example illustrated in FIG. 2, the uppermost P type buried layer is the P type buried layer 162 that is formed in a horizontal direction of the P type substrate 100, spaced apart from an oxide layer 150, which may be a LOCOS oxide layer.

The plurality of P type buried layers 161, 162, as depicted in FIG. 2, may be formed as to be spaced apart from each other in the downward direction, below the oxide layer 150. The plurality of N type drift regions 171, 172 of FIG. 2 that fully enclose the P type buried layers 161,162 may be formed to partially overlap each other between the P type buried layers 161, 162. Through the formation of the plurality of N type drift regions 171, 172 and P type buried layers 161, 162, the resistance of the current path in the drain region of the LDMOS formed below and over the P type buried layers 160 may be reduced and a plurality of current paths may be ensured. Therefore, the conduction losses can be reduced while maintaining fast switching characteristics.

A drain region 140 is formed in one region of the deep N type well 130. In the depicted example, for example, the drain region 140 may be formed of an N+ type region through an ion implantation and a diffusion process. Alternatively, the drain region 140 may be formed in a trench structure and include at least one selected from an electrically conductive material consisting of an N+ type polysilicon material, titanium (Ti), titanium nitride (TiN), and tungsten (W) that fills the trench.

In the above-described various examples, the N+ type drain region 140 may be formed in contact with one end of the P type buried layer and one end of the N type drift region. For example, the N+ type drain region 140 may be configured such that the drain region is in contact with the plurality of P type buried layers 161, 162 and the plurality of N type drift region 171, 172 that fully enclose the P type buried layers 161, 162.

In the present example, a current path that extends from a source to a drain is formed in a deep N type well 130 that is doped with a low doping concentration to ensure that the breakdown voltage between the deep N type well 130 and the substrate 110 is higher or equal to the necessary breakdown voltage of the completed transistor. When the drain region 140 is formed of an N+ type region and the P type buried layer 160 is formed in contact with the N+ type drain region 140, the resistance of the current path is reduced. For example, the current path may be configured to pass through the N type drift region 170 that fully enclose the P type buried layer 160, and a plurality of current paths may be formed between the source and the drain. A power device having low on-resistance may be formed through the above-described effects.

At this time, an N+ type region 142 may be formed in the drain region 140. Hereafter, the N+ type region 142 may be electrically connected to a drain electrode.

The oxide layer 150 provides insulation between the gate region and the drain region of the semiconductor power device. In one example, as the oxide layer 150, a LOCOS oxide layer may be used. In the alternative, a plate-shaped insulating layer or STI layer may be used. In example, an N type impurity region that extends toward a gate direction may be formed between the channel formed in the device and the drain region, below the oxide layer 150. Hereinafter, the impurity region is referred to as an N-TOP region 152. The N-TOP region 152 functions to connect a channel region of the semiconductor power device and a current path, thus reducing the on-resistance.

Further, a gate oxide layer 153 may be formed to insulate the gate region 155 from other devices.

A P type body region 180 may be formed in a region of the P type epitaxial layer 120 in which the deep N type well 130 is not formed. Further, P+ type body-contact or pick up region 181 and N+ source region 182 may be formed in the P type body region 180. Further, a P type region 185 that is simultaneously in contact with the body region 180 and the semiconductor substrate 110 may be further formed. The P type region 185 may be formed before the P type body region 180 is formed, and may further reduce the resistance of the body region 180. The P type region 185 can be a P well region that is generally used to form the body region of low-voltage NMOS transistors that may be integrated into the same wafer, as in the case of BCD wafers such as bipolar-CMOS-DMOS wafers and the like.

Further, in one example, a plurality of P type epitaxial layers 120 may be formed. For example, to form the epitaxial layers 120, epitaxial layers doped with the same conductivity type impurities (P type impurities or N type impurities) may be used. In this example, concentrations of the impurities applied to the epitaxial layers may be different from each other or be the same as each other. As the plurality of epitaxial layers 120, epitaxial layers separately doped with P type impurities or N type impurities may be used.

When a plurality of P type epitaxial layers 120 are formed, a corresponding one P type buried layer and a corresponding one N type drift region may be formed in any two epitaxial layers to overlap with each other. The N type drift region may extend outside of the P type buried layer so that N type drift region 170 fully encloses the P type buried layer.

In addition, a separate gate electrode, a source electrode, and a drain electrode may be formed on the semiconductor power device so as to be connected to the corresponding technical configurations. As a method of forming the electrodes, various processes that may easily be applied by those skilled in the art may be used. For example, a metal interconnection process including forming a salicide 191, 192, and 193 using $TiSi_2$ or $CoSi_2$, using Ti/TiN/W as a contact plug (not shown), and using metal layer such as Al, AlCu, or Cu (not shown) may be performed to form an electrode.

Figure 3:
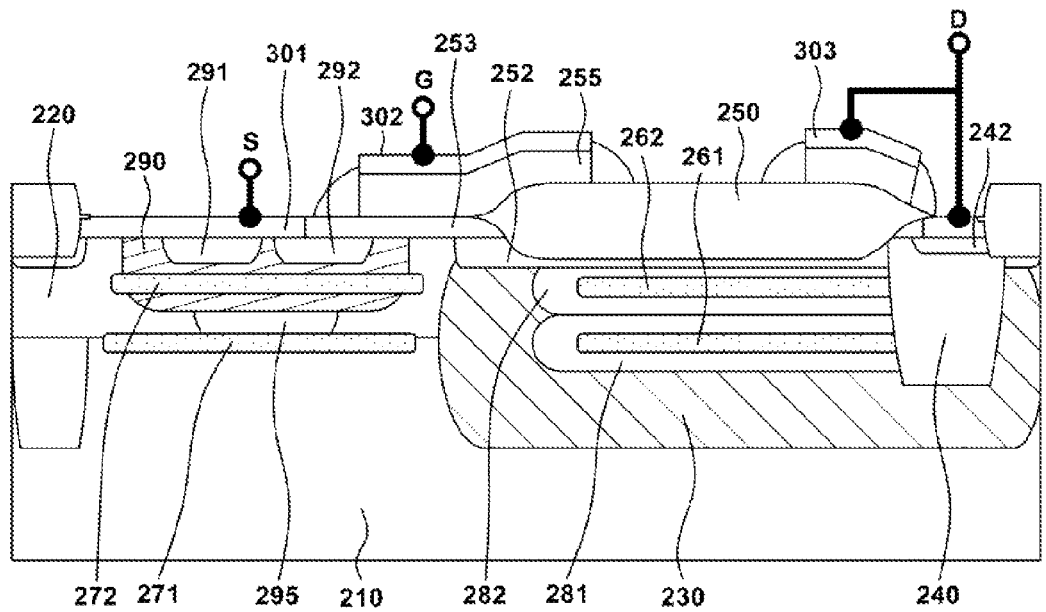
FIG. 3 is a cross-sectional view illustrating another example of a power device.

FIG. 3 is a cross-sectional view of another example of a power device according to the present disclosure.

As illustrated in FIG. 3, a semiconductor power device according to one example of the present disclosure includes a P type semiconductor substrate 210, an N type epitaxial layer 220 formed on the semiconductor substrate 210, a deep N type well 230 formed in the semiconductor substrate 210 and the epitaxial layer 220, a drain region formed in a portion of the deep N type well 230, an oxide layer 250 configured to provide insulation between a gate region and the drain region, a first-first P type buried layer 261 and a first-second P type buried layer 262 formed in the deep N type well 230, a second-first P type buried layer 271 formed on the semiconductor substrate 210 and a second-second P type buried layer 272 formed in a region of the epitaxial layer 220 in which the well 230 is not formed, and a first drift region 281 and second drift region 282 that fully enclose the first-first buried layer 261 and first-second buried layer 262, respectively, and are doped with N type impurities. The drain region 240 may be formed in contact with one end of the first-first P type buried layer 261, first-second P type buried layer 262, first drift region 281 and second drift region 282.

In this example, the ion implantation concentration of the first N type drift region 281 and the second N type drift region 282 is higher than that of the deep N type well 230 because the first N type drift region 281 and the second N type drift region 282 are formed by performing an additional ion implanting process on the deep N type well 230. Other methods may be used in other examples, such that the ion implantation concentration of the N type drift region is higher than that of the deep N type well 230. As a result, the on-resistance of the device can be lowered. Using this characteristic, it is possible to fabricate a power device that has a low on-resistance value.

Other features of the power device depicted in FIG. 3 are the same as those of the power device depicted in FIG. 2. Thus, the detailed description thereof will be omitted here, and the differences between the two examples are explained below.

The example of the power device illustrated in FIG. 3 is different from the power device illustrated in FIG. 2 in that the epitaxial layer 220 has a different conductivity type from the semiconductor substrate 210. That is, as illustrated in FIG. 3, instead of a P type epitaxial layer, an N type epitaxial layer 220 is formed on the semiconductor substrate 210.

Further, in the example of the power device depicted in FIG. 3, the second-first P type second buried layer 271 and the second-second P type buried layer 272 are formed in the P type substrate 210 or in a region of the N type epitaxial layer 220 in which the deep N type well 230 is not formed. As illustrated in FIG. 3, the second-first P type second buried layer 271 and the second-second P type buried layer 272 are formed on the substrate in which the deep N type well 230 is not formed.

The second-first P type buried layer 271 and second-second P type buried layer 272 formed in the upper portion of the P type substrate 210 or in the N type epitaxial layer 220 may compensate charges of the N type epitaxial layer 220 to reduce the resistance of the current path through charge balance.

The drain region, oxide layer, the body region, and the like are the same as those of the power device illustrated in FIG. 2, and as such, detailed description thereof will be omitted here.

FIGS. 4A to 4D are views illustrating an example of a method of fabricating a power device according to present disclosure.

Figure 4A:
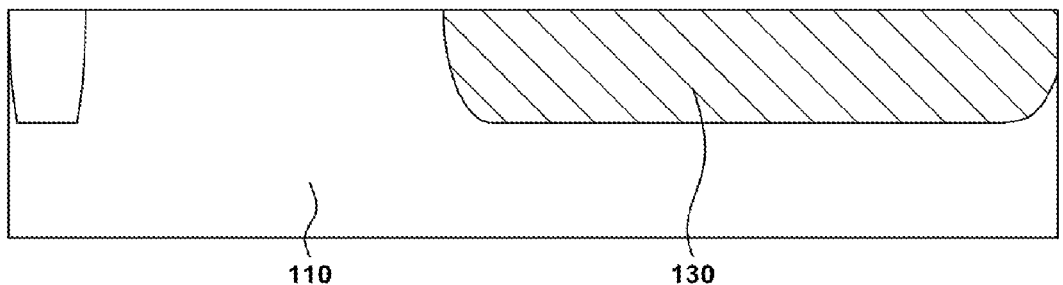
FIGS. 4A to 4D are views illustrating an example of a method of fabricating a power device according to yet another example of the present disclosure.

First, as illustrated in FIG. 4A, a deep N type well 130 is formed in a P type semiconductor substrate 110. At this time, the deep N type well 130 is formed not in the whole P type substrate 110 but in a portion of the P type substrate 110 which will become the drain region of a lateral high-voltage transistor. To form the deep N type well 130, a fabrication process such as a mask process and an ion implantation process that may be employed by those skilled in the art may be used.

Figure 4B:
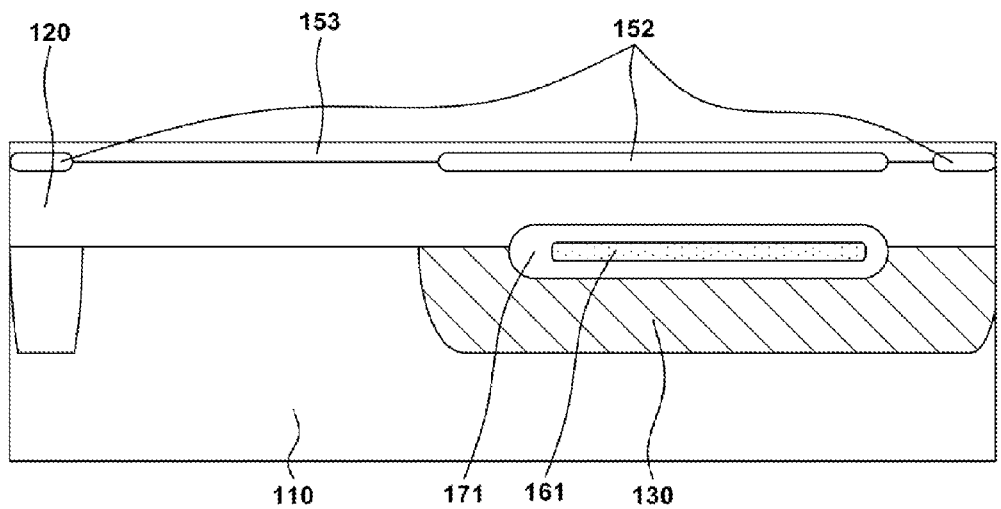

As illustrated in FIG. 4B, a first P type buried layer 161 is formed in the deep N type well 130. The first P type buried layer 161 may be formed with a shallow depth in the deep N type well 130 through a shallow ion implantation process. In this example, the first P type buried layer 161 is formed not to a deep depth from a surface of the deep N type well 130, but to a shallow depth from the surface of the deep N type well 130. That is, in this example, the first P type buried layer 161 may be formed through an ion implantation process that uses relative low energy.

A first N type drift region 171 is provided to fully enclose the first P type buried layer 161. The first N type drift region 171 may be formed through an ion implantation with moderate to high energy. For example, the first N type drift region 171 may be formed through a TILTED and quad rotation ion implantation process so as to surround the P type buried region 161, as familiar to people skilled in the art. This ensure that the first N type drift region 171 will extend outside of the first P type buried layer 161.

In this example, the ion implantation concentration of the first N type drift region 171 and the second N type drift region 172 is higher than that of the deep N type well 130 because the first N type drift region 171 and the second N type drift region 172 are formed by performing an additional ion implanting process to the deep N type well 130. In other examples, other methods may be used so that the ion implantation concentration of the N type drift region is higher than that of the deep N type well 130. As a result, the on-resistance of the device may be lowered. Using this characteristic, it is possible to fabricate a power device having a low on-resistance value.

Subsequently, a P type epitaxial layer 120 is grown on the semiconductor substrate in which the P type buried layer 160 and the N type drift region 170 are formed. In one example, the thickness (or the height) of the P type epitaxial layer 120 may be in a range of 1 to 4 μm.

In another example, N type impurities having a low dose may be implanted in a region of a surface of the P type epitaxial layer 120 so as to form an N-TOP region 152. At this time, the N-TOP region 152 functions to connect the channel region of the semiconductor power device and the current path in order to reduce the on-resistance.

Subsequently, a thin surface oxide layer 153 may be formed on the surface of the N-TOP region 152 and the epitaxial layer 120.

The next steps involve the formation of N type drain region 140 and P type region 185 that are commonly used for other devices which may be integrated with the high-voltage LDMOS, such as CMOS (N well 140 for the body of the PMOS, P well 185 for the body of the NMOS).

Figure 4C:
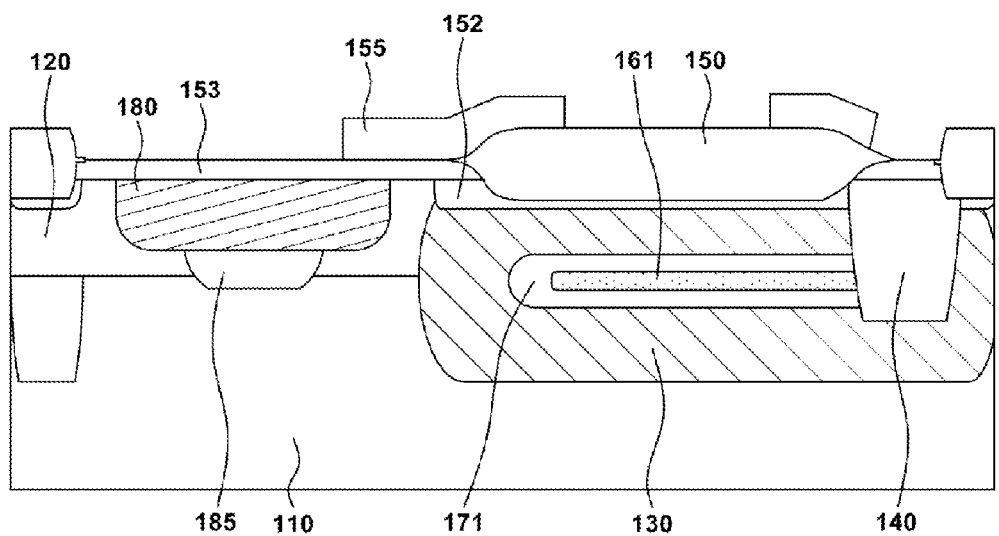

As illustrated in FIG. 4C, a thermal diffusion process may be performed on the deep N type well 130, and an N type drain region 140 may be formed in the deep N type well 130. At this time, the drain region 140 may include the deep N type well 130, or the drain region 140 may have a trench structure.

Further, an oxide layer 150 configured to insulate a gate region from the drain region may be further formed in an upper portion of the P type epitaxial layer 120. In one example, the oxide layer may be a LOCOS oxide layer, a plate-shaped insulating layer, or a STI layer.

A P type body region 180 is formed in one region of the P type epitaxial layer 120 in which the deep N type well 130 is not formed.

Further, a gate region 155 may be formed on one side of the oxide layer 150. The gate region 155 may be formed through various processes.

In an example, the method may further include forming a P type region 185 in one region of the P type epitaxial layer. At this time, the P type region 185 may be formed only in the P type epitaxial layer. For example, the P type region 185 may be formed to connect the P type substrate 110 and the P type epitaxial layer 120. The P type region 185 can be the P well body region of low-voltage NMOS transistors integrated with the high-voltage LDMOS device.

Figure 4D:
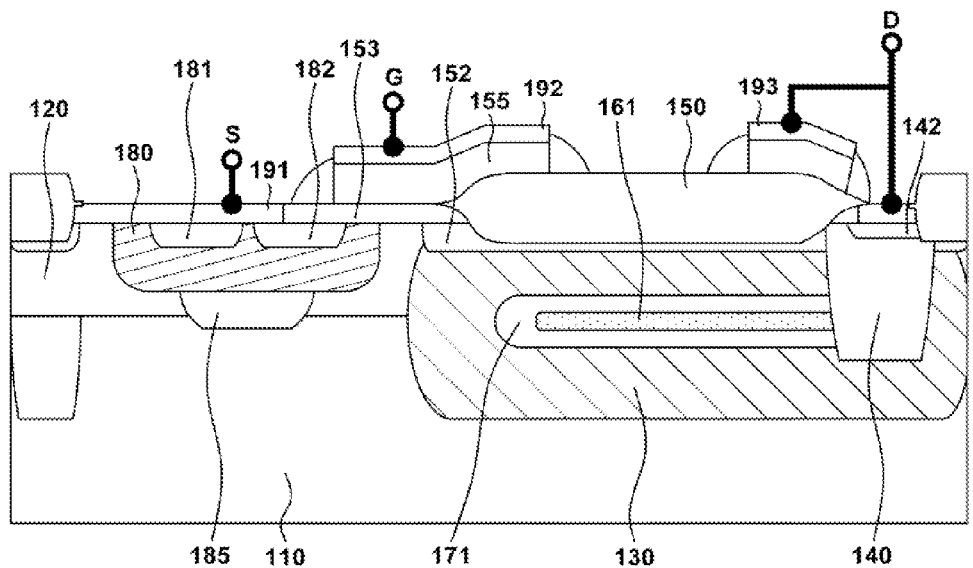

As illustrated in FIG. 4D, a P+ pick up region 181 and an N+ source region 182 may be formed in the body region 180. any method known to those skilled in the art may be applied to implement the P+ pick up region 181 and the N+ source region 182.

Also, an N+ region 142 may be formed in the drain region 140. The N+ region 142 may be electrically connected to a drain electrode. In addition, a separate gate electrode, a source electrode, and a drain electrode may be formed on the semiconductor power device in order to connect the device according to corresponding technical configurations that is desired for an application. In this example, as a method of forming the electrodes, various processes that are known to those skilled in the art may be applied. For example, a metal interconnection process involving forming a salicide 191, 192, and 193 using $TiSi_2$ or CoSi2, and using Ti/TiN/W as a contact plug (not shown), and forming a metal layer such as Al, AlCu, or Cu (not shown), may be performed.

FIGS. 5A to 5E are views illustrating an example of a method of fabricating a power device according to the present disclosure.

Figure 5A:
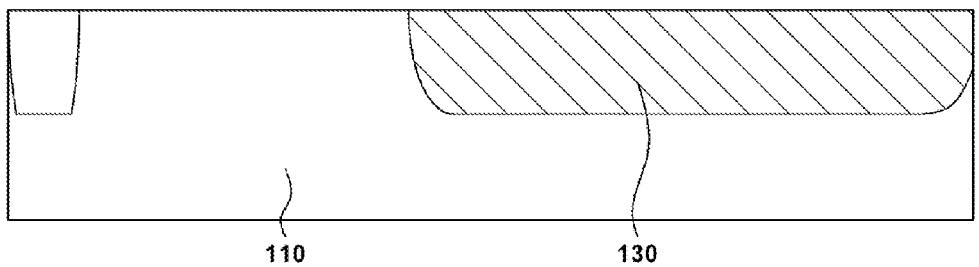
FIGS. 5A to 5E are views illustrating another example of a method of fabricating a power device.
Figure 5B:
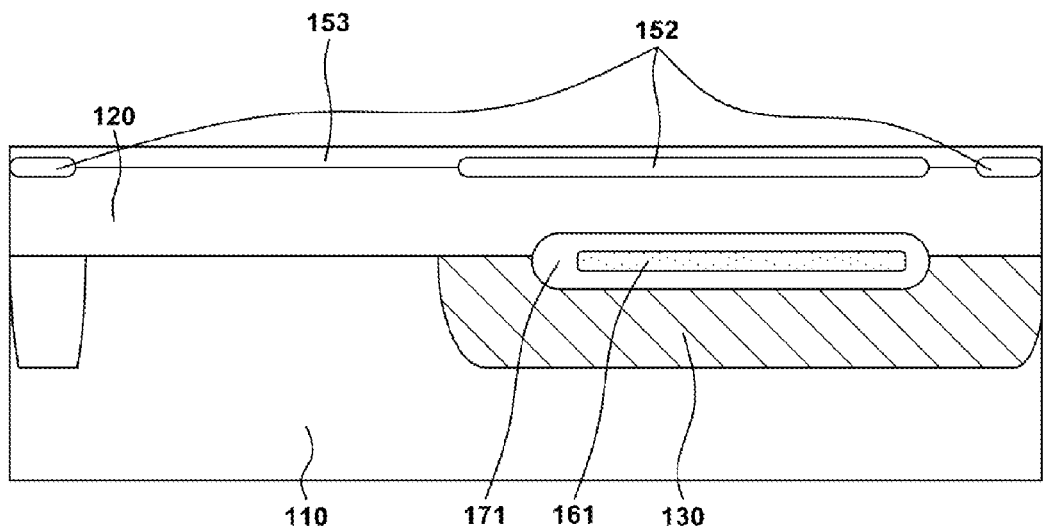

Processes illustrated in FIGS. 5A and 5B are the same as those illustrated in FIGS. 4A and 4B, and thus detailed description thereof will be omitted.

Figure 5C:
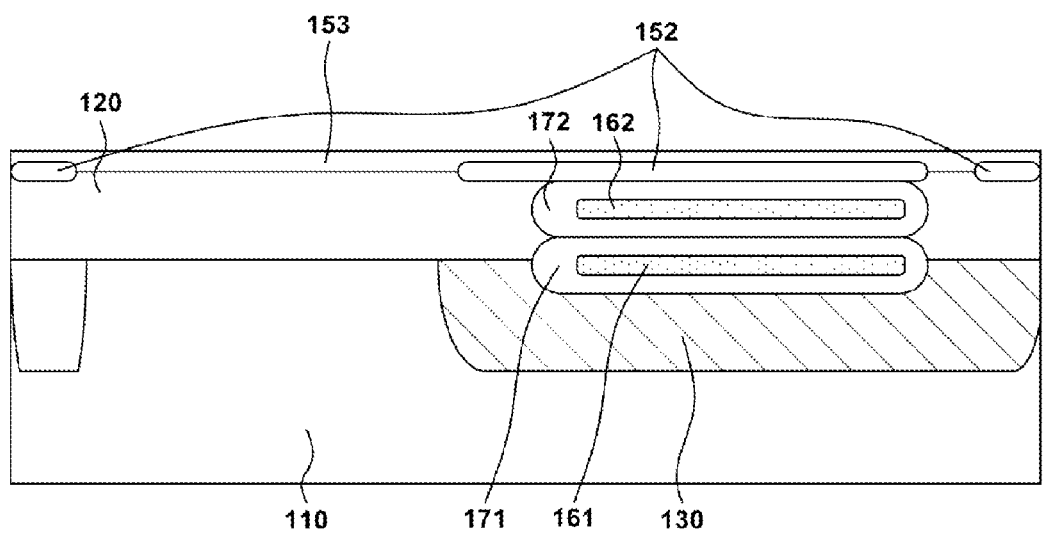

As illustrated in FIG. 5C, to form a second P type buried layer 162, P type impurities are horizontally ion implanted in the P type epitaxial layer 120 to a predetermined depth from a surface of a P type epitaxial layer 120 grown as illustrated in FIG. 5B. At this time, the second P type buried layer 162 is formed to be vertically spaced from a first P type buried layer 161 formed in FIG. 5B.

Through an ion implantation process similar to the formation method of a first N type drift region 171 illustrated in FIG. 5B, a second N type drift region 172 fully enclosing the second P type buried layer 162 is formed. At this time, the second N type drift region 172 may be formed to partially overlap the first N type drift region 171. The second N type drift region 172 may be formed of multiple ion implantation steps. For example, a shallow N type implant above second P type buried layer 162, a deeper N type implant below second P type buried layer 162 and tilted quad-rotated deeper implants to ensure that the second N type drift region fully encloses the second P type buried layer 162.

Figure 5D:
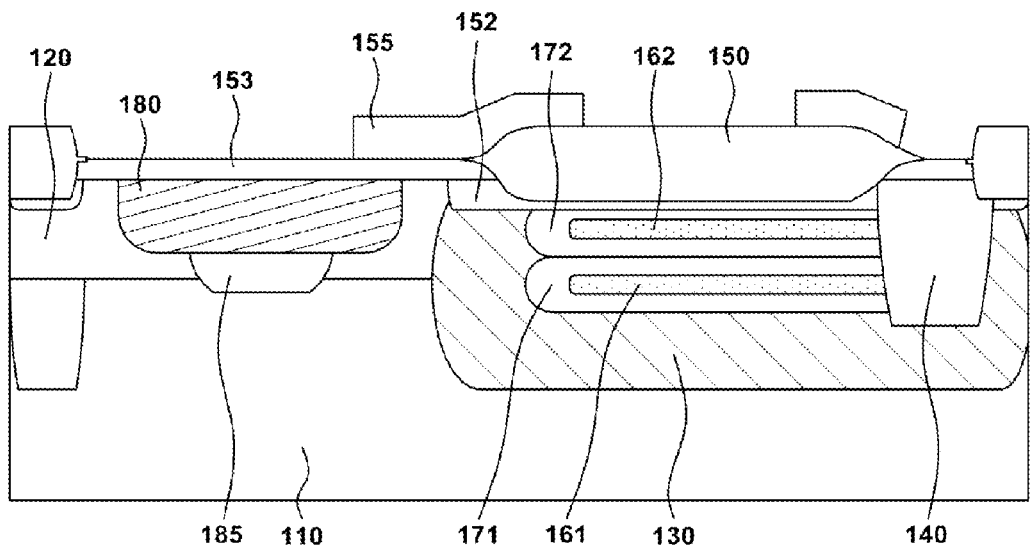
Figure 5E:
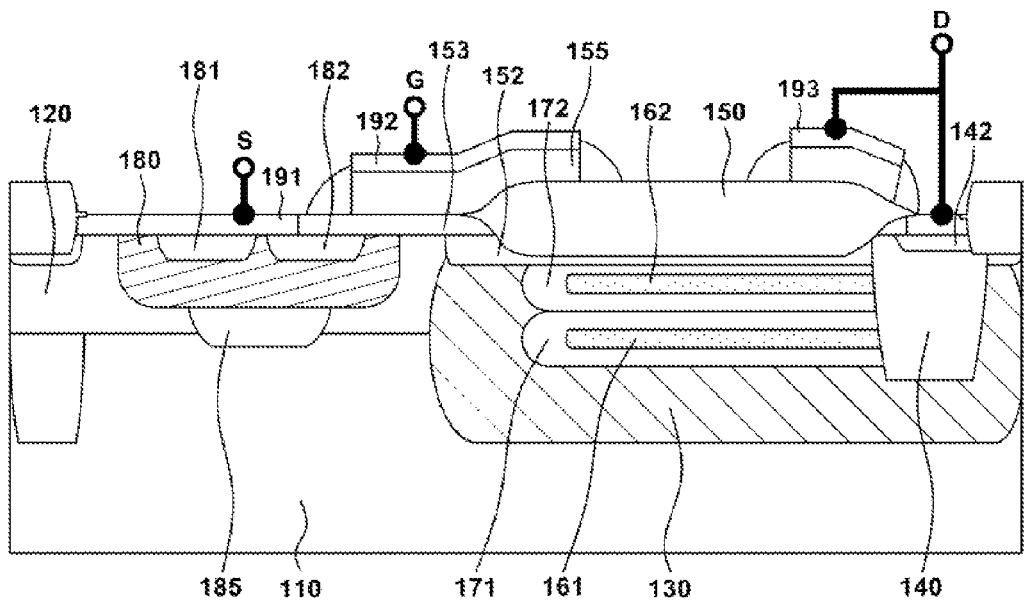

Like the processes illustrated in FIGS. 4C and 4D, a diffusion process is performed to form a deep N type well 130. An N type drain region 140 is formed in the deep N type well 130. Further, a P type body region 180 is formed in one region of the P type epitaxial layer 120 in which the deep N type well 130 is not formed. Processes illustrated in FIGS. 5D and 5E are the same as those illustrated in FIGS. 4C and 4D, and thus the detailed description thereof will be omitted.

FIGS. 6A to 6H are views illustrating another example of a method of fabricating a power device according to the present disclosure.

A method of fabricating a power device illustrated in FIGS. 6A to 6H is different from the methods illustrated in FIGS. 4A to 4C and FIGS. 5A to 5E in that a plurality of epitaxial layers are formed.

Figure 6A:
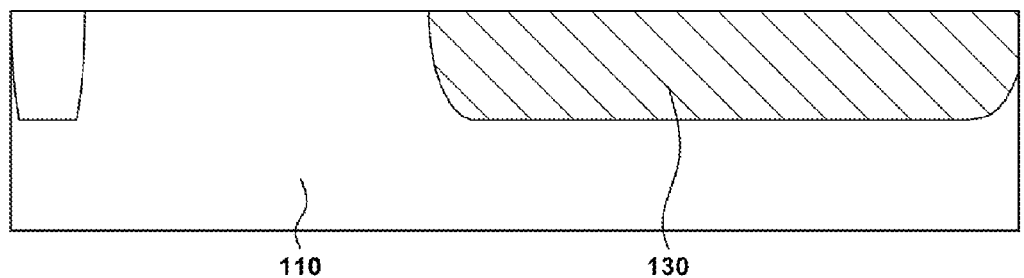
FIGS. 6A to 6F are views illustrating another example of a method of fabricating a power device.
Figure 6B:
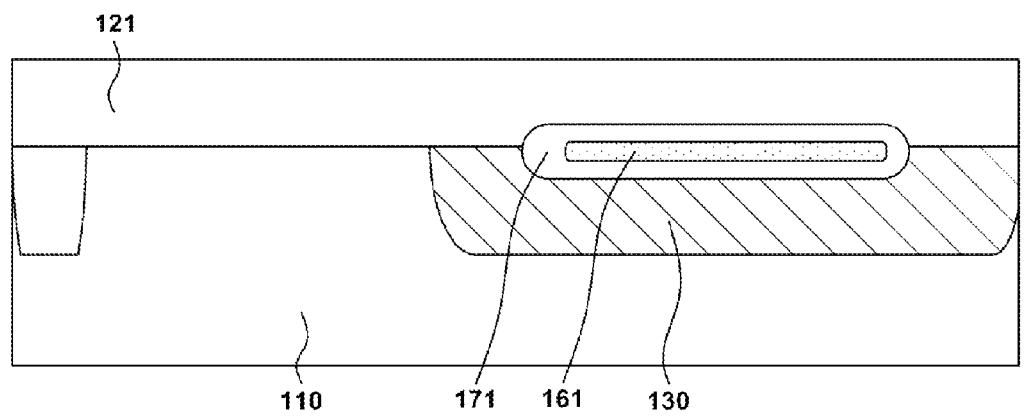
Figure 6C:
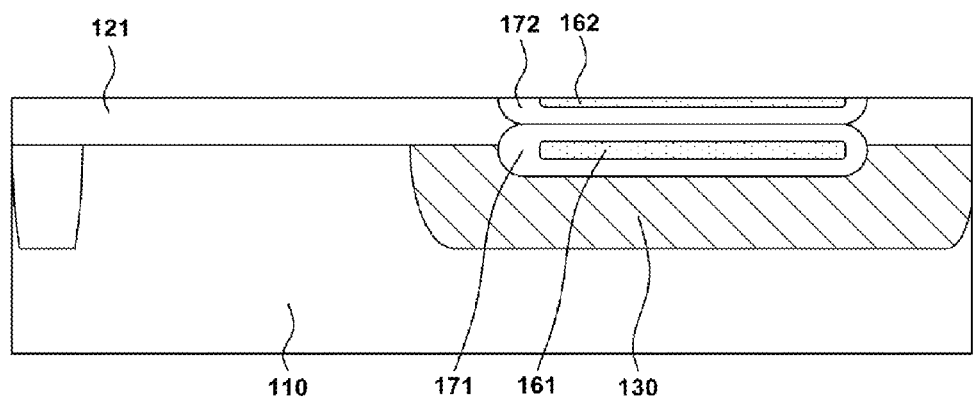

In general, processes of FIG. 6A to FIG. 6C are the same as those in the fabrication method illustrated in FIGS. 5A to 5C. However, as illustrated in FIG. 6C, a P type second buried layer 162 and an N type second drift region 172 may be formed to have a shallower depth than those of FIG. 5C from a surface of a first epitaxial layer 121. The remaining features illustrated in FIG. 6A to FIG. 6C are the same as the features illustrated in the method of FIGS. 5A to 5E, and a detailed description thereof will be omitted.

Figure 6D:
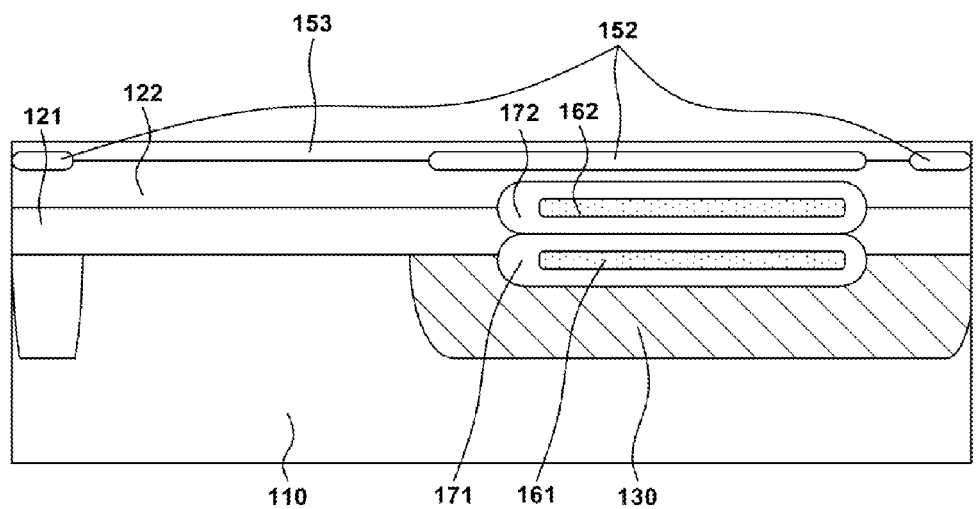

As illustrated in FIG. 6D, a P type second epitaxial layer 122 is grown on the first epitaxial layer 121 in which the P type second buried layer 162 and the N type second drift region 172 are formed. At this time, a thickness (or, the height) of the P type second epitaxial layer 122 may be in the range of 1 to 4 μm.

In another example, N type impurities having a low dose may be ion implanted in one region of a surface of the P type epitaxial layer 122 to form an N-TOP region 152. For instance, the N-TOP region 152 may function to connect a channel region of the semiconductor power device and the current path in order to reduce the on-resistance value.

Subsequently, a thin surface oxide layer 153 may be formed on the surface of the N-TOP region 152 and the second epitaxial layer 122.

Figure 6E:
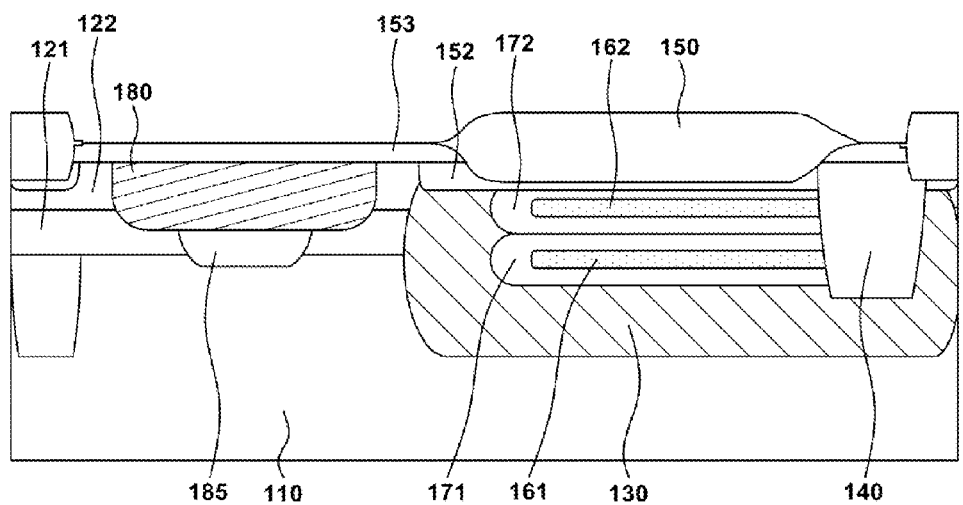
Figure 6F:
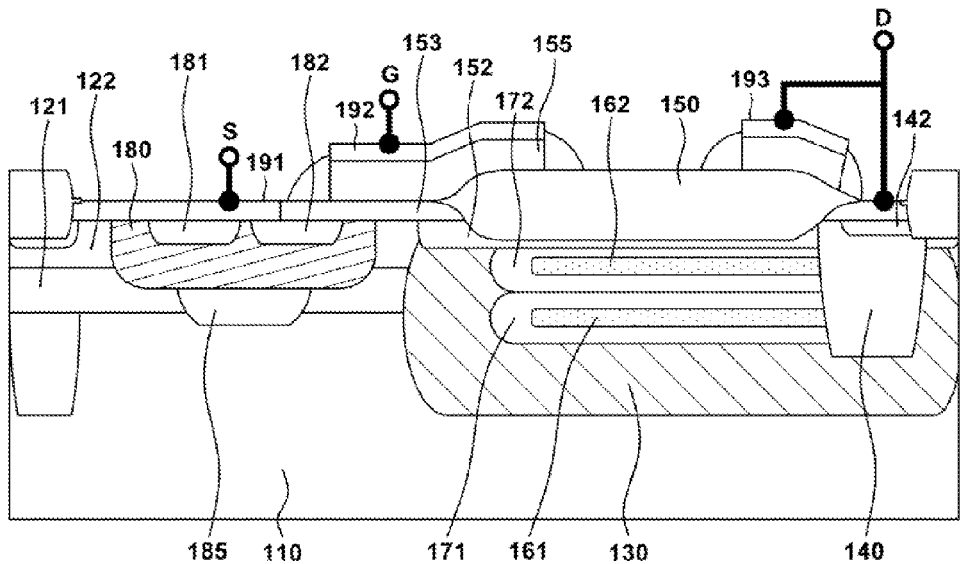

Like the processes of the example illustrated in FIGS. 4C and 4D, a diffusion process is performed to form a deep N type well 130. An N type drain region 140 is formed in the deep N type well 130. Further, a P type body region 180 is formed in regions of the P type epitaxial layers 121 and 122 in which the deep N type well 130 is not formed. Processes depicted in FIGS. 6E and 6F are the same as those depicted in FIGS. 4C and 4D, and therefore a detailed description thereof will be omitted.

FIGS. 7A to 7G are views illustrating another method of fabricating a power device according to the present disclosure.

Processes of FIG. 7A to FIG. 7D are the same as those in the fabrication method illustrated in FIGS. 6A to 6D, and thus the detailed description thereof will be omitted.

Figure 7A:
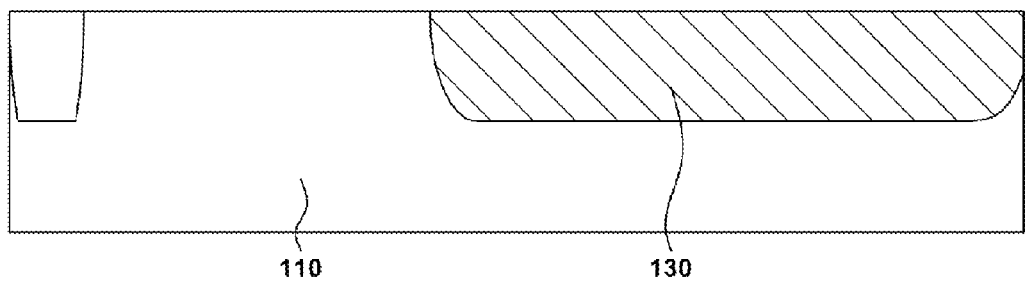
FIGS. 7A to 7G are views illustrating another example of a method of fabricating a power device.
Figure 7B:
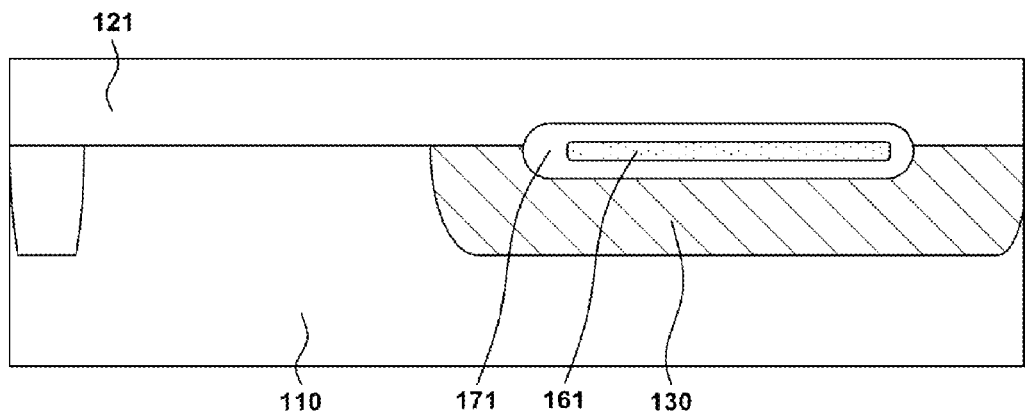
Figure 7C:
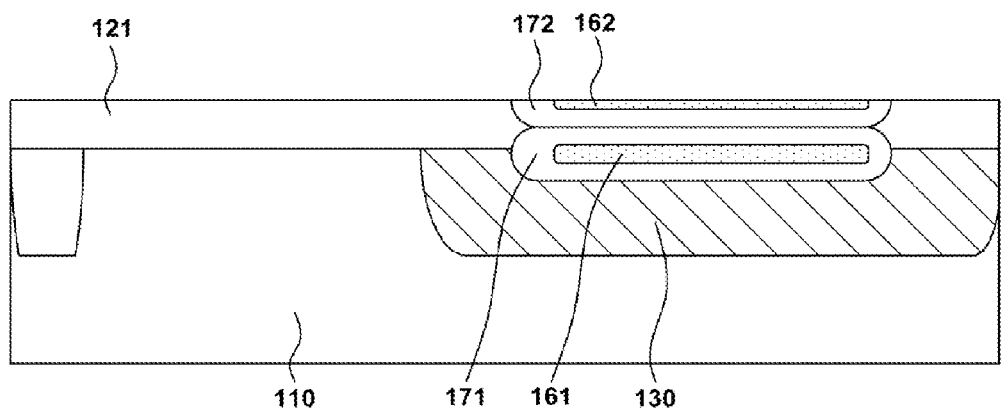
Figure 7D:
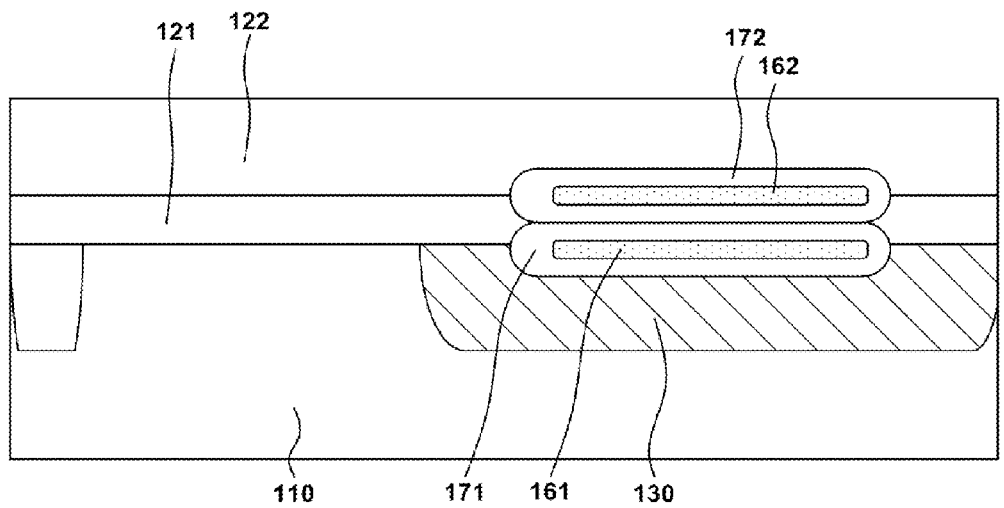
Figure 7E:
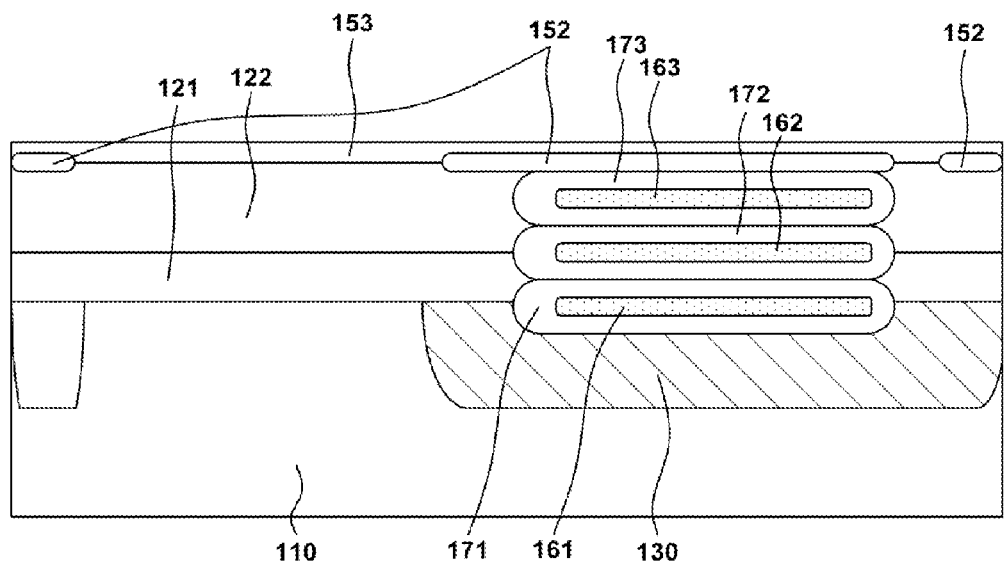

As illustrated in FIG. 7E, a P type third buried layer 163 is formed by horizontally ion implanting P type impurities into a P type second epitaxial layer 122 grown in FIG. 7D to a predetermined depth from a surface of the P type second epitaxial layer 122. At this time, the P type third buried layer 163 is formed to be vertically spaced from a P type first buried layer 161 and a P type second buried layer 162 previously formed.

Through an ion implantation process similar to formation methods of an N type first drift region 171 and an N type second drift region 172 illustrated in FIGS. 7C and 7D, an N type third drift layer 173 that fully encloses the P type third buried layer 163 is formed. In this example, the N type third drift region 173 may be formed to partially overlap the N type second drift region 172.

In another example, N type impurities having a low dose may be ion implanted in one region of a surface of the P type epitaxial layer 122 to form an N-TOP region 152. At this time, the N-TOP region 152 may function to connect a channel region of the semiconductor power device and the current path in order to reduce the on-resistance value.

Hereafter, a thin surface oxide layer 153 may be formed on the surface of the N-TOP region 152 and the second epitaxial layer 122.

Like the processes of the example illustrated in FIG. 4C and FIG. 4D, a diffusion process is performed on a deep N type well 130 and an N type drain region 140 is formed in the deep N type well 130. The drain region 140 may be the N type body region of a low-voltage PMOS transistor integrated with the high-voltage LDMOS device. Further, a P type body region 180 is formed in regions of the P type epitaxial layers 121 and 122 in which the deep N type well 130 is not formed.

Figure 7F:
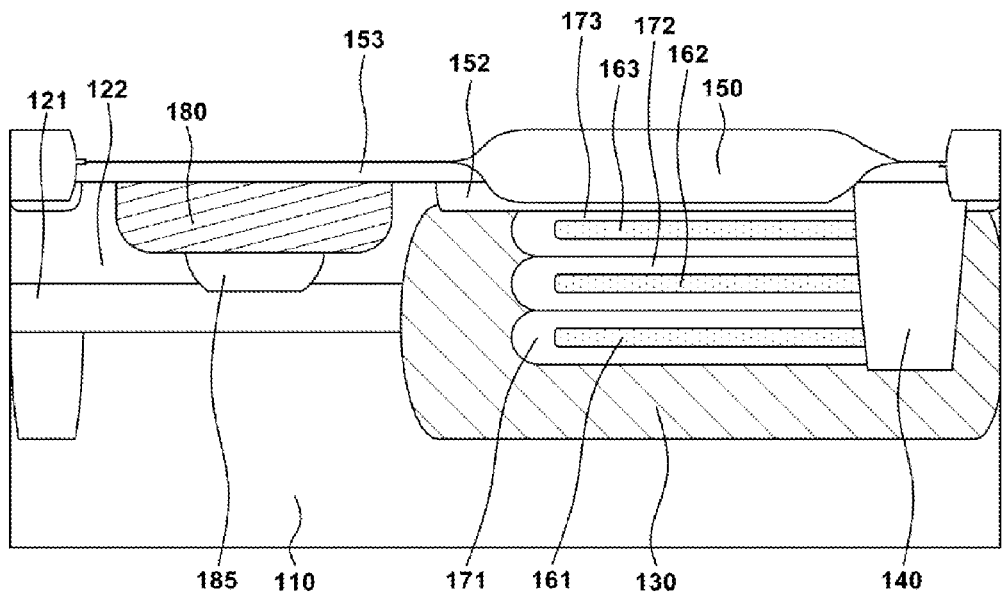
Figure 7G:
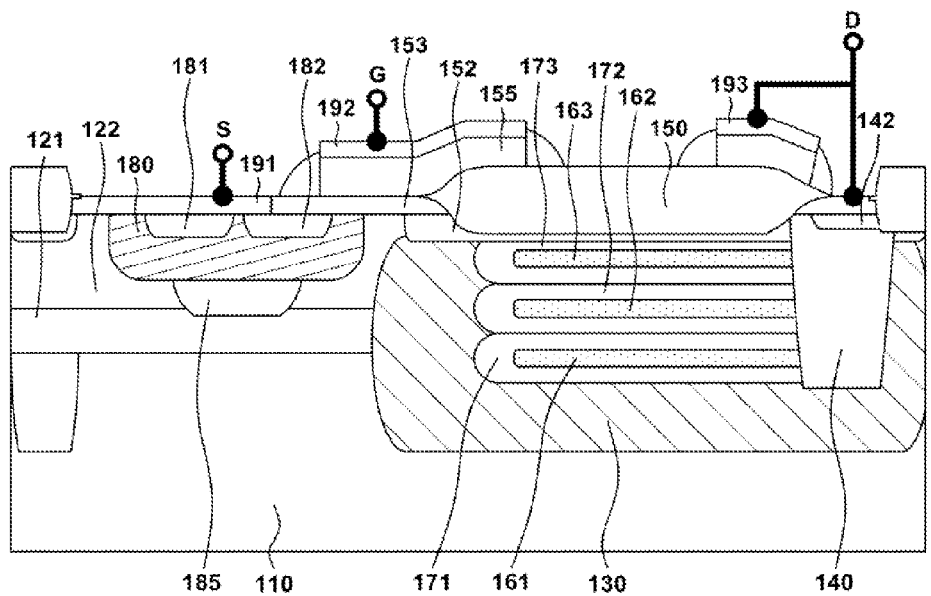

Processes in FIGS. 7F and 7G are the same as those of FIGS. 4C and 4D, and thus the detailed description thereof will be omitted.

FIGS. 8A to 8H are views illustrating another example of a method of fabricating a power device according to the present disclosure.

Figure 8A:
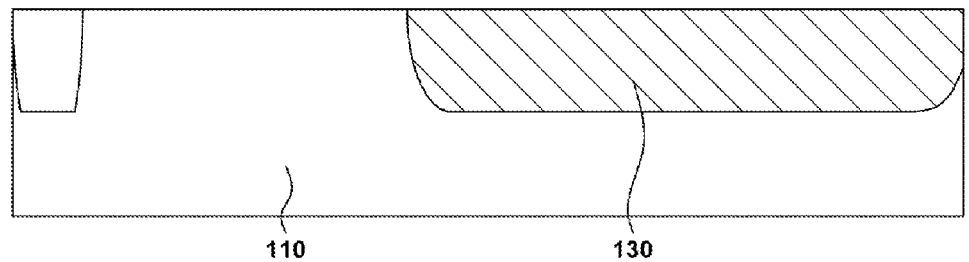
FIGS. 8A to 8H are views illustrating another example of a method of fabricating a power device.
Figure 8B:
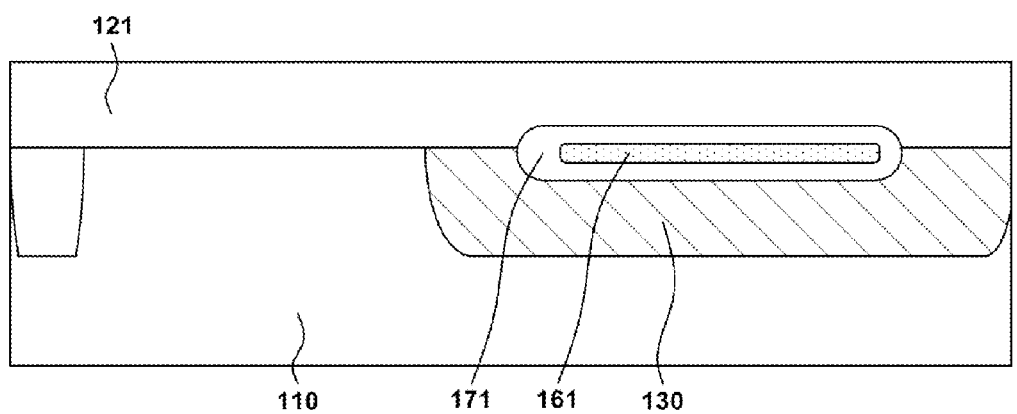
Figure 8C:
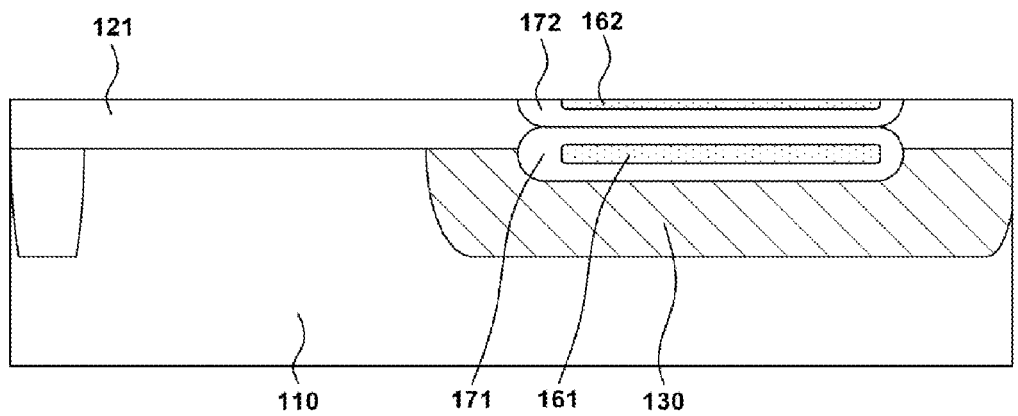
Figure 8D:
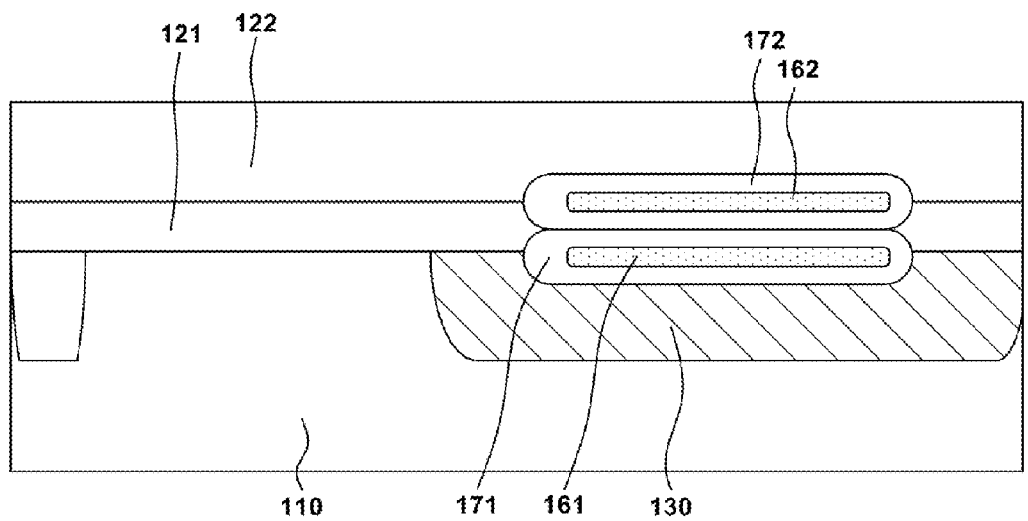
Figure 8E:
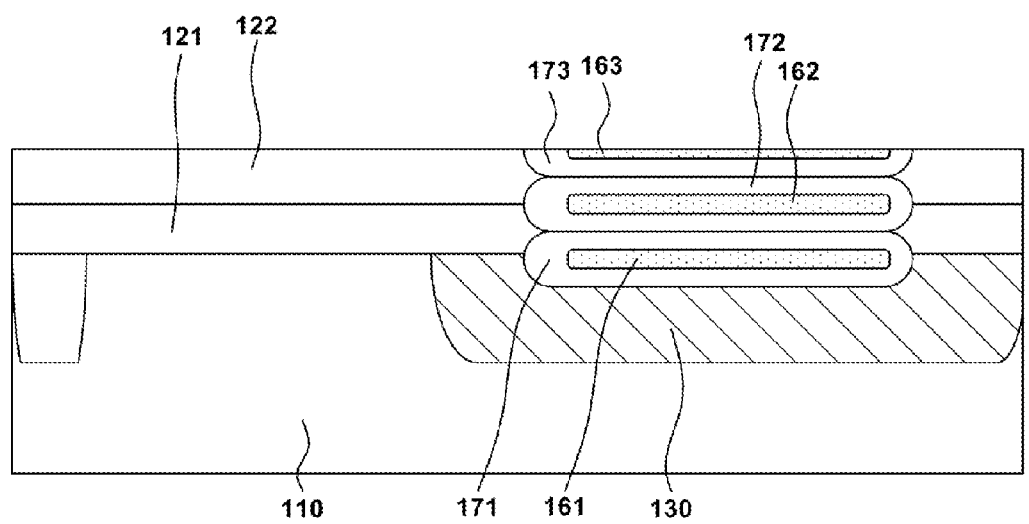

Processes illustrated in FIG. 8A to FIG. 8E are the same as those of the fabrication method illustrated in FIGS. 7A to 7E. However, as illustrated in FIG. 8E, a third P type buried layer 163 and an third N type drift region 173 may be formed to have a shallower depth than those of FIG. 7E from a surface of the second epitaxial layer 122. The remaining configurations in FIGS. 8A to 8E are the same as those depicted in FIGS. 7A to 7G, and thus the detailed description thereof will be omitted.

Figure 8F:
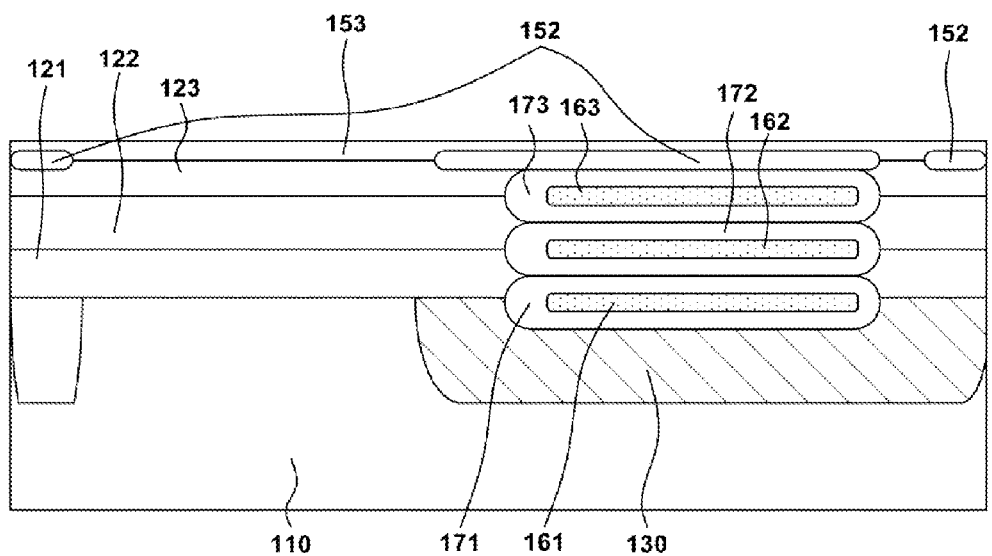

As illustrated in FIG. 8F, a third P type epitaxial layer 123 is grown on the second epitaxial layer 122 in which the third P type buried layer 163 and the third N type drift region 173 are formed. In one example, the thickness of the third P type epitaxial layer 123 may be in a range of 1 to 4 μm.

In another example, N type impurities having a low dose may be implemented in a region of a surface of the P type epitaxial layer 120 and formed N-TOP region 152. At this time, the N-TOP region 152 functions to connect the channel region of the semiconductor power device and the current path to reduce the on-resistance value.

Thereafter, a thin surface oxide layer 153 may be formed on surfaces of the N-TOP region 152 and the epitaxial layer 123.

Figure 8G:
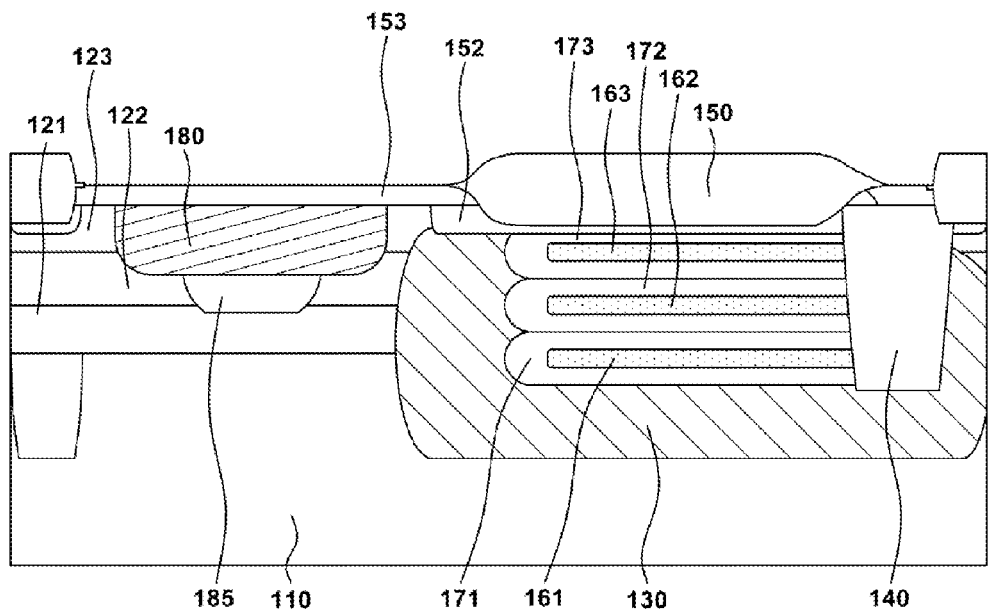
Figure 8H:
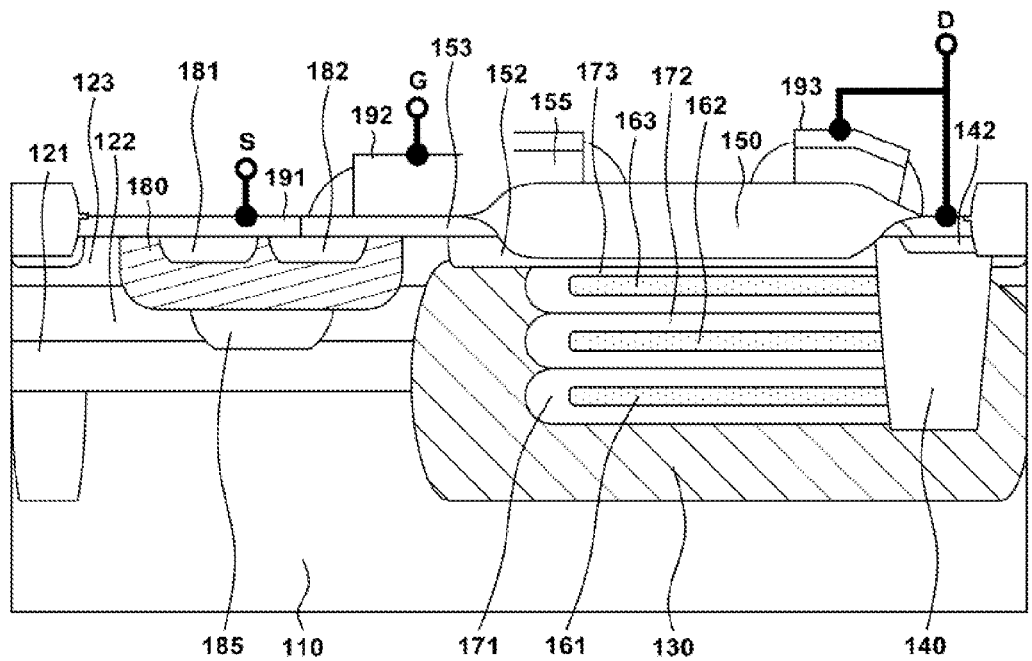

Like the processes illustrated in FIG. 4C, a diffusion process is performed on a deep N type well 130, and an N type drain region 140 is formed in the deep N type well 130. Further, a P type body region 180 is formed in regions of the P type epitaxial layers 121, 122, and 123 in which the deep N type well 130 is not formed. Processes in FIGS. 8G and 8H are the same as those of FIGS. 4C and 4D, and thus the detailed description thereof will be omitted.

FIGS. 9A to 9D are views illustrating another example of a method of fabricating a power device according to the present disclosure.

Figure 9A:
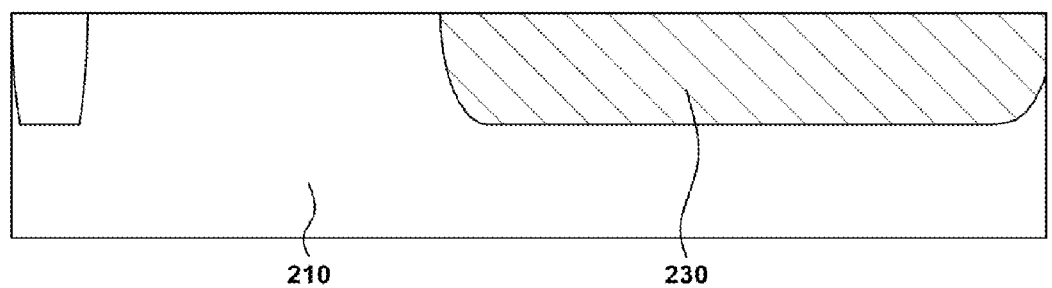
FIGS. 9A to 9D are views illustrating yet another example of a method of fabricating a power device.

First, as illustrated in FIG. 9A, a deep N type well 230 is formed on a P type semiconductor substrate 210. At this time, the deep N type well 230 is formed not in the whole P type substrate 210 but in a portion of the P type substrate 210. As the formation method of the deep N type well 230, processes such as a mask process and an ion implantation process that are known to those skilled in the art may be employed.

Figure 9B:
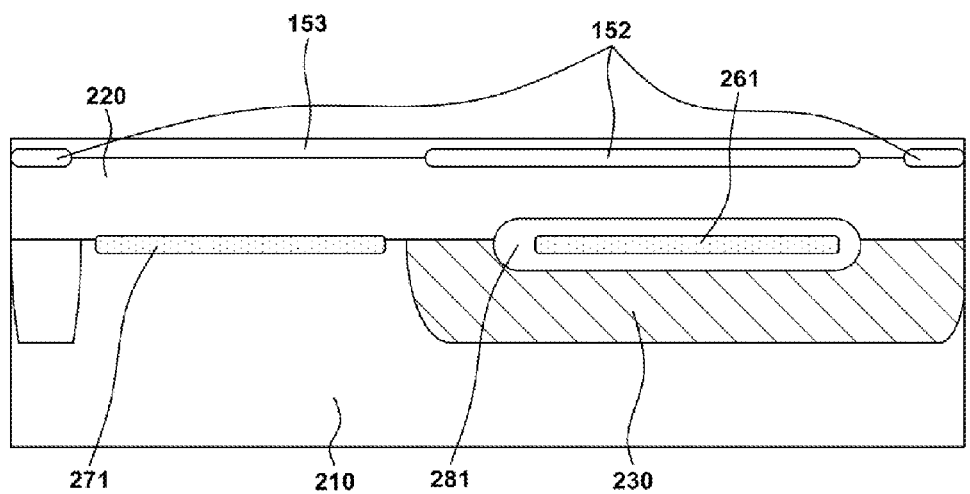

As illustrated in FIG. 9B, a first-first P type buried layer 261 is formed in the deep N type well 230. At this time, the first-first P type buried layer 261 may be formed to a shallow depth in the deep N type well 230 through a shallow ion implantation process. In this example, the first-first P type buried layer 261 is formed not to a deep depth from a surface of the deep N type well 230; rather it is formed to a shallow depth from the surface of the deep N type well 230. That is, the first-first P type buried layer 261 may be formed through an ion implantation process with relative low energy.

At this time, a second-first P type buried layer 271 is formed in one region of the P type substrate 210 in which the deep N type well 230 is not formed. The formation method of the second-first P type buried layer 271 is the same as that of the first-first P type buried layer 261, and thus detailed description thereof will be omitted.

The first N type drift region 281 that fully encloses the first-first P type buried layer 261 is formed. The first N type drift region 281 may be also formed through an ion implantation with low energy. At this time, the first N type drift region 281 may be formed through a tilted and quad rotation ion implantation process to surround the P type first buried region 260.

Subsequently, an N type epitaxial layer 220 is grown on the semiconductor substrate in which the P type first buried layer 270, the second P type buried layer 260, and the N type first drift region 280 are formed. At this time, the thickness of the N type epitaxial layer 220 may be in a range of 1 to 4 μm.

In another example, N type impurities having a low dose may be implanted in a region of a surface of the N type epitaxial layer 220 to form an N-TOP region 252. In such an example, the N-TOP region 252 functions to connect the channel region of the semiconductor power device and the current path in order to reduce the on-resistance.

Hereafter, a thin surface oxide layer 153 may be formed on surfaces of the N-TOP region 152 and the epitaxial layer 123.

Figure 9C:
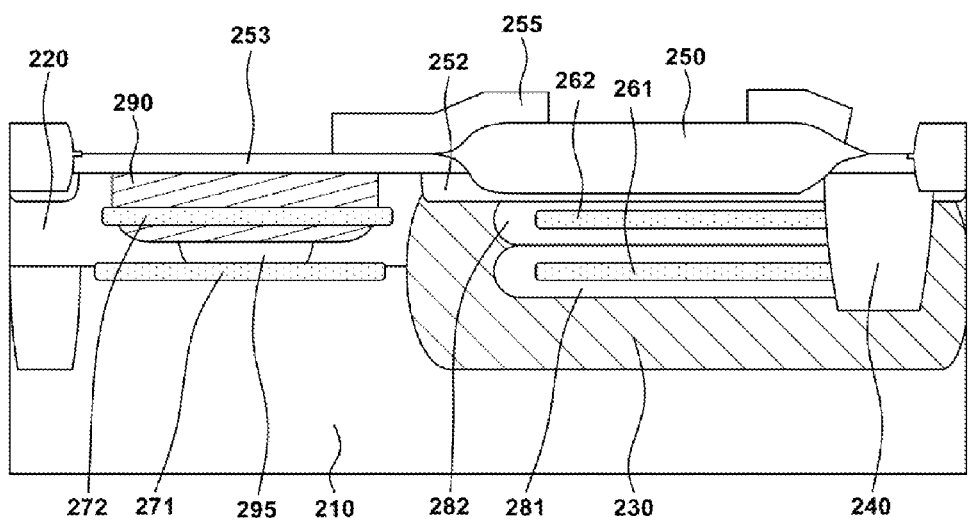

As illustrated in FIG. 9C, The first-second P type buried layer 262 and the second-second P type buried layer 272 may be formed using an ion implantation method with energy higher than that in an ion implantation method of forming the first-first P type first buried layer 261 and the second-first P type second buried layer 271.

FIG. 9C has illustrated that two first P type buried layers 261, 262 and two second P type buried layers 271, 272 are formed and are formed to be vertically spaced from each other. Three or more first and second buried layers may be applied.

Subsequently, a diffusion process is performed on the deep N type well 230 and an N type drain region 240 is formed in the deep N type well 230. Again, the drain region 240 may be the N-Well body diffusion of low-voltage PMOS transistors integrated with the high-voltage LDMOS transistor. Further, a oxide layer 250 configured to insulate between a gate region and the drain region may be further formed in an upper portion of the P type epitaxial layer 220. In the preferred exemplary embodiment, the oxide layer 250 may include any one selected from the group consisting of a LOCOS oxide layer, a plate-shaped insulating layer, and a STI layer.

Hereafter, a shallow N type region 242 having a higher doping concentration may be formed in the drain region 240. Further, a P type contact region may be formed in one region of the N type epitaxial layer in which the deep N type well 230 is not formed. At this time, the deep N type well 230 and the P type region 295 may be formed before the forming of the oxide layer 250. Then, a gate oxide and a polysilicon layer are formed.

Further, a P type body region 290 is formed in one region of the epitaxial layer 220 in which the deep N type well 230 is not formed. Thereafter, a P+ type pick up region 291 and an N+ type source region 292 may be formed in the body region 290. As the method of forming the regions, any methods known to those skilled in the art may be employed.

The second P type buried layers 271 and 272, the P type body region 290, and the P type region 295 may compensate charges of the N type epitaxial layer to reduce resistance of the current path through charge balance. Again, the P type region 295 may be the N-well body region of a low-voltage NMOS transistor integrated with the high-voltage LDMOS transistor.

The charge compensation called the charge balance means just a RESURF effect. For example, an ion implantation amount of N type ions for formation of the second P type buried layers 271 and 272 are adjusted to balance charges of the first P type buried layer 261 and 262. The charge balance provides a high breakdown voltage, and increase the charges of the first N type drift regions 281 and 282 to maximum to reduce the resistance.

Figure 9D:
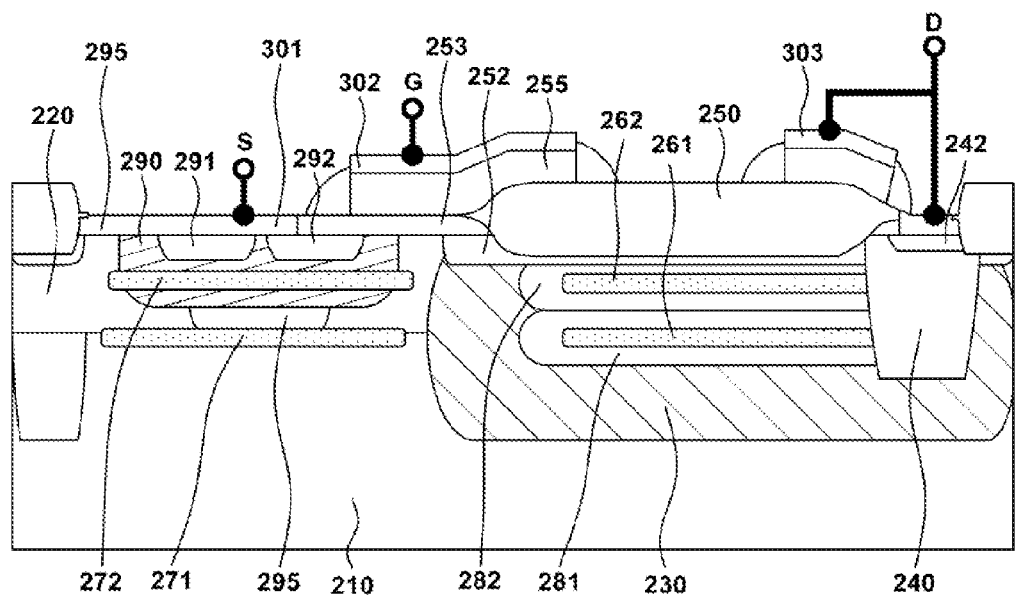

As illustrated in FIG. 9D, a separate gate electrode, a source electrode, and a drain electrode may be formed on the semiconductor power device. As the electrode formation methods, various processes known to those skilled in the art may be used.

As illustrated in FIG. 9D, a separate gate electrode, a source electrode, and a drain electrode may be formed on the semiconductor power device to connect to devices with corresponding technical configurations. At this time, as a method of forming the electrodes, various processes known to those skilled in the art may be used. For example, a metal interconnection process including forming a salicide 301, 302 and 303 using TiSi$_2$ or CoSi$_2$, using Ti/TiN/W as a contact plug (not shown), and using metal layer such as Al, AlCu, or Cu (not shown) may be performed.

The example illustrated in FIGS. 9C and 9D includes one epitaxial layer; however, in other embodiments, a plurality of epitaxial layers may be provided. In such an example, the plurality of epitaxial layers may be doped with the same conductivity impurities. Alternatively, the plurality of epitaxial layers may be separately doped with P type impurities or N type impurities.

In various examples described above, a semiconductor power device with an improved structure to simultaneously achieve a high-breakdown voltage, low resistance and fast switching characteristics, as compared with the known devices were described. Further described were various methods of fabricating such a semiconductor device.

The examples of semiconductor power devices having the above-described structures may have the following effects.

In some of the examples, one of a buried layer and a drain region which are doped with the same conductivity type dopants as those of a semiconductor substrate are extended into a well of the semiconductor substrate so that the buried layer is in contact with the drain region. In other words, the buried layer may be formed to extend to a direction of the drain region or the drain region may extend in the well.

Further, examples of described method may form a drift region fully enclosing the buried layer and doped with the same conductivity type dopants as those of the well. In some examples, the buried layer and the drift region are formed to be in contact with the drain region.

A doping layer doped with the same conductivity type dopants with a high concentration as those of the well may be further formed between the buried layer and the semiconductor substrate. In some examples, the buried layer and the doping layer are formed to be in contact with the drain region.

Therefore, with the examples of the present disclosure, it is possible to reduce the on-resistance of a lateral DMOS transistor while maintaining a high breakdown voltage and fast switching characteristics, due to optimized dopants in drain extension region which includes a well.

The present disclosure may be applied to a power device including an epitaxial layer as well as power devices having a LOCOS oxide layer, a plate-shaped insulating layer, and an STI structure in addition to the power device having the well. Therefore, the device of the present disclosure has wide application coverage, and thus may provide a competitive cost.

Further, the present disclosure relates to various examples of methods of fabricating a semiconductor power device having a multiple RESURF structure through an ion implantation process with relatively low energy by forming a separate epitaxial layer and forming the P type buried layer in the epitaxial layer as compared with the conventional art without an high-energy ion implantation process for forming the P type buried layer.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. A semiconductor power device comprising:
a first conductivity type semiconductor substrate;
an epitaxial layer formed on the semiconductor substrate;
a second conductivity type well formed in the semiconductor;
a drain region formed in the well;
an oxide layer that insulates a gate region from the drain region;
a first conductivity type buried layer formed in the well;
a second conductivity type drift region surrounding the buried layer along at least a lateral side and a bottom side of the buried layer, the drift region disposed in the well; and
a second conductivity type TOP region formed between the buried layer and the oxide layer.

2. The semiconductor power device according to claim 1, comprising a plurality of buried layers and a plurality of drift regions, the plurality of drift regions each surrounding a buried layer of the plurality of buried layers,
wherein the plurality of buried layers are spaced apart from each other along a vertical direction below the oxide layer, and the plurality of drift regions partially overlap with each other.

3. The semiconductor power device according to claim 1, wherein the epitaxial layer is a first conductivity type epitaxial layer;
the drift region completely encloses the buried layer; and
the TOP region is formed in a region between the oxide layer and the buried layer and extends toward the gate region in a horizontal direction.

4. The semiconductor power device according to claim 1, wherein the oxide layer includes one selected from the group consisting of a local oxidation of silicon (LOCOS) oxide layer, a plate-shaped oxide layer, and a shallow trench isolation (STI) layer.

5. The semiconductor power device according to claim 1, further comprising a first conductivity type body region formed in a portion of the epitaxial layer in which the well is not formed.

6. The semiconductor power device according to claim 1, wherein the drain region is formed in a trench structure.

7. The semiconductor power device according to claim 6, wherein the drain region contacts one end of the drift region and one end of the buried layer.

8. The semiconductor power device according to claim 1, comprising a plurality of epitaxial layers, the first conductivity type epitaxial layer being one of the plurality of epitaxial layers.

9. The semiconductor power device according to claim 1, wherein the drift region has an ion implantation concentration higher than that of the well.

10. The semiconductor power device according to claim 1, wherein the well contacts the TOP region.

11. The semiconductor power device according to claim 1, wherein the well has a depth deeper than that of the epitaxial layer.

12. A semiconductor power device comprising:
a first conductivity type semiconductor substrate;
a second conductivity type epitaxial layer formed on the semiconductor substrate;
a second conductivity type well formed in the semiconductor substrate;
a drain region formed in the well;
an oxide layer that insulates a gate region from the drain region;
a first conductivity type first buried layer formed in the well;
a first conductivity type second buried layer formed on the semiconductor substrate in which the well is not formed;
a second conductivity type first drift region surrounding the first buried layer along at least a lateral side and a bottom side of the first buried layer, the drift region disposed in the well; and
a second conductivity type TOP region formed between the first buried layer and the oxide layer.

13. The semiconductor power device according to claim 12, comprising a plurality of first buried layers and a plurality of first drift regions, the plurality of first drift regions each surrounding the first buried layer of the plurality of first buried layers,
wherein the plurality of first buried layers are spaced apart from each other along a vertical direction below the oxide layer, and the plurality of first drift regions partially overlap with each other.

14. The semiconductor power device according to claim 12, wherein the first drift region completely encloses the first buried layer, and the TOP region is formed in a channel between the oxide layer and the first buried layer and extends toward the gate region in a horizontal direction.

15. The semiconductor power device according to claim 12, comprising a plurality of second buried layers, the plurality of second buried layers being spaced apart from each other along a vertical direction.

16. The semiconductor power device according to claim 12, wherein the oxide layer includes one selected from the group consisting of a local oxidation of silicon (LOCOS) oxide layer, a plate-shaped oxide layer, and a shallow trench isolation (STI) layer.

17. The semiconductor power device according to claim 12, further comprising a first conductivity type body region formed on the semiconductor substrate in which the well is not formed.

18. The semiconductor power device according to claim 12, wherein the drain region is formed in a trench structure, wherein the drain region contacts one end of the first drift region and one end of the first buried layer.

19. The semiconductor power device according to claim 12, comprising a plurality of epitaxial layers, the second conductivity type epitaxial layer being one of the plurality of epitaxial layers.

20. The semiconductor power device according to claim 12, wherein the drift region has an ion implantation concentration higher than that of the well.

21. The semiconductor power device according to claim 12, wherein the well contacts the TOP region.

22. The semiconductor power according to claim 12, wherein the well has a depth deeper than that of the epitaxial layer.

* * * * *